US012586881B2

(12) United States Patent
Mori

(10) Patent No.: US 12,586,881 B2
(45) Date of Patent: Mar. 24, 2026

(54) MULTILAYERED FILTER DEVICE

(71) Applicant: TDK CORPORATION, Tokyo (JP)

(72) Inventor: Naoyuki Mori, Tokyo (JP)

(73) Assignee: TDK CORPORATION, Tokyo (JP)

( * ) Notice: Subject to any disclaimer, the term of this patent is extended or adjusted under 35 U.S.C. 154(b) by 140 days.

(21) Appl. No.: 18/591,477

(22) Filed: Feb. 29, 2024

(65) Prior Publication Data

US 2024/0304970 A1     Sep. 12, 2024

(30) Foreign Application Priority Data

Mar. 8, 2023     (JP) ................................. 2023-035506

(51) Int. Cl.
*H01P 1/203*     (2006.01)
*H03H 7/01*     (2006.01)
*H03H 7/09*     (2006.01)

(52) U.S. Cl.
CPC ....... *H01P 1/20345* (2013.01); *H03H 7/0161* (2013.01); *H03H 7/09* (2013.01)

(58) Field of Classification Search
CPC ......... H03H 7/0115; H03H 2001/0085; H03H 7/1708; H03H 7/1775; H03H 7/1766; H03H 7/0161; H03H 7/1758; H03H 7/09; H03H 7/1725; H03H 7/463; H03H 7/0123; H03H 7/0138; H03H 7/1791;

H03H 7/0169; H03H 7/075; H03H 7/17; H03H 7/1741; H03H 7/425; H03H 9/0561; H01F 2017/0026; H01F 2027/2809; H01F 27/2804; H01F 17/0013; H01F 27/40; H01F 27/292; H01F 2017/002; H01F 19/04; H01F 2017/004; H01G 4/30; H01G 4/40; H01G 4/012; H01G 4/38
See application file for complete search history.

(56) References Cited

U.S. PATENT DOCUMENTS

| | | | |
|---|---|---|---|
| 11,757,424 B2 * | 9/2023 | Sato ..................... | H03H 7/1741 333/167 |
| 12,334,894 B2 * | 6/2025 | Matsumoto .......... | H03H 7/0115 |
| 2013/0229241 A1 | 9/2013 | Imamura | |

* cited by examiner

*Primary Examiner* — Lincoln D Donovan
*Assistant Examiner* — Tyler J Pereny
(74) *Attorney, Agent, or Firm* — Oliff PLC

(57)     ABSTRACT

A filter device includes a first filter including a first inductor, a second filter including a second inductor, a third filter including a third inductor, and a fourth filter including a fourth inductor. The first to fourth inductors are arranged in a manner that an opening of the first inductor and an opening of the third inductor face each other, an opening of the second inductor and an opening of the fourth inductor face each other, the opening of the first inductor and the opening of the second inductor do not face each other, and the opening of the third inductor and the opening of the fourth inductor do not face each other.

12 Claims, 10 Drawing Sheets

MULTILAYERED FILTER DEVICE

CROSS REFERENCE TO RELATED APPLICATIONS

This application claims the benefit of Japanese Priority Patent Application No. 2023-35506 filed on Mar. 8, 2023, the entire contents of which are incorporated herein by reference.

BACKGROUND OF THE INVENTION

1. Field of the Invention

The present invention relates to a multilayered filter device including a low-pass filter and a high-pass filter.

2. Description of the Related Art

One of electronic components used in a communication apparatus is a band-pass filter. Such a band-pass filter can be constituted, for example, by connecting a high-pass filter forming an attenuation pole on a low-frequency side of a passband of the band-pass filter and a low-pass filter forming an attenuation pole on a high-frequency side of the passband of the band-pass filter, in series.

The recent market demands for reductions in size and footprint of compact mobile communication apparatuses and also requires miniaturization of band-pass filters for use in those communication apparatuses. One known example of a band-pass filter suitable for downsizing is a band-pass filter using a stack including a plurality of dielectric layers and a plurality of conductor layers stacked together.

Each of a high-pass filter and a low-pass filter includes an inductor. One known example of such an inductor used for a band-pass filter using a stack is an inductor composed of a conductor layer and a plurality of through holes and wound around an axis orthogonal to a stacking direction of a plurality of dielectric layers.

US 2013/0229241 A1 discloses a multilayer band pass filter that is not a band-pass filter composed of a high-pass filter and a low-pass filter but includes a plurality of inductors each wound around an axis orthogonal to a stacking direction of a plurality of dielectric layers.

When a high-pass filter and a low-pass filter are integrated with a stack, reduction in size of the stack causes an unintended magnetic coupling occurring between the plurality of inductors in the stack to be too strong in some cases. This prevents desired characteristics from being achieved in some cases. In particular, in a band-pass filter composed of a plurality of high-pass filters and a plurality of low-pass filters, if magnetic coupling between a plurality of inductors of the plurality of high-pass filters is too strong, this may cause a problem that adjustment of an attenuation pole formed on a low-frequency side of a passband of the band-pass filter is difficult. Similarly, if magnetic coupling between a plurality of inductors of the plurality of low-pass filters is too strong, this may cause a problem that adjustment of an attenuation pole formed on a high-frequency side of the passband of the band-pass filter is difficult.

The above-described problems apply, not only to a case of adjusting attenuation poles in a band-pass filter composed of a plurality of high-pass filters and a plurality of low-pass filters, but also to a case in general of performing adjustment of characteristics including adjustment of attenuation poles in a multilayered filter device including a plurality of high-pass filters and a plurality of low-pass filters.

SUMMARY OF THE INVENTION

An object of the present invention is to provide a multilayered filter device that is composed of a plurality of high-pass filters and a plurality of low-pass filters and can be miniaturized while facilitating adjustment of characteristics.

A multilayered filter device of the present invention includes: a first filter which is a low-pass filter including a first inductor; a second filter which is a low-pass filter including a second inductor; a third filter which is a high-pass filter including a third inductor; a fourth filter which is a high-pass filter including a fourth inductor; and a stack for integrating the first filter, the second filter, the third filter, and the fourth filter, the stack including a plurality of dielectric layers stacked together. Each of the first inductor, the second inductor, the third inductor, and the fourth inductor is wound around an axis orthogonal to a stacking direction of the dielectric layers. The first inductor, the second inductor, the third inductor, and the fourth inductor are arranged in a manner that an opening of the first inductor and an opening of the third inductor face each other, an opening of the second inductor and an opening of the fourth inductor face each other, the opening of the first inductor and the opening of the second inductor do not face each other, and the opening of the third inductor and the opening of the fourth inductor do not face each other.

In the multilayered filter device of the present invention, the first to the fourth inductors are arranged as described above. Thus, according to the present invention, it is possible to provide a multilayered filter device that can be miniaturized while facilitating adjustment of characteristics.

Other and further objects, features, and advantages of the present invention will appear more fully from the following description.

DETAILED DESCRIPTION OF THE PREFERRED EMBODIMENTS

First Embodiment

Figure 1:
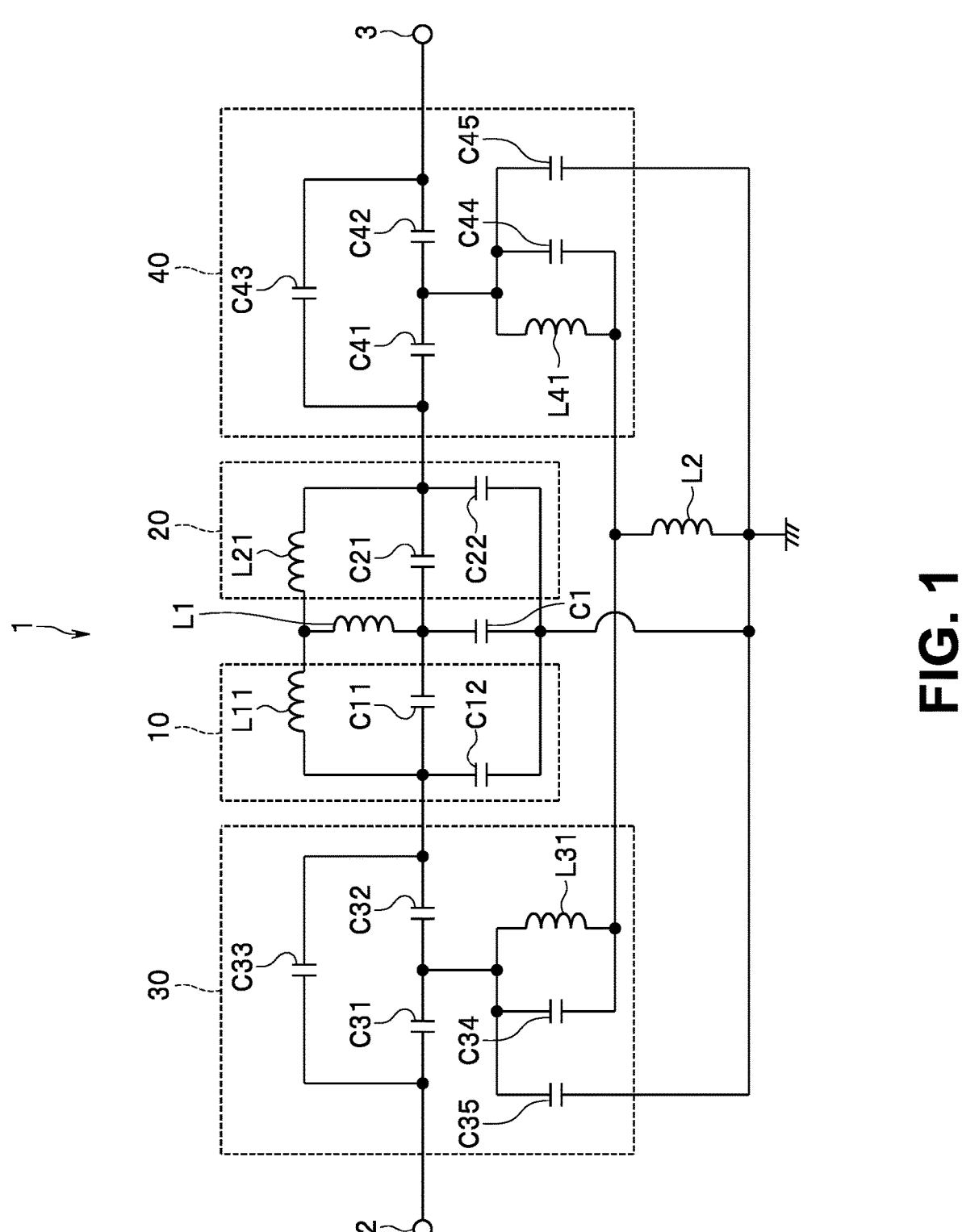
FIG. 1 is a circuit diagram showing a circuit configuration of a multilayered filter device according to a first embodiment of the present invention.

An embodiment of the present invention will be described below in detail with reference to the drawings. A configuration of a multilayered filter device (hereinafter, referred to simply as a filter device) 1 according to one embodiment of the present invention will initially be outlined with reference to FIG. 1.

The filter device 1 includes a first signal terminal 2, a second signal terminal 3, a first filter 10, a second filter 20, a third filter 30, and a fourth filter 40. Each of the first and second signal terminals 2 and 3 is a terminal for inputting or outputting a signal. In other words, when a signal is input to the first signal terminal 2, a signal is output from the second signal terminal 3. When a signal is input to the second signal terminal 3, a signal is output from the first signal terminal 2.

The first filter 10 is a low-pass filter including a first inductor. The second filter 20 is a low-pass filter including a second inductor. The third filter 30 is a high-pass filter including a third inductor. The fourth filter 40 is a high-pass filter including a fourth inductor. The first to fourth filters 10, 20, 30, and 40 are provided between the first signal terminal 2 and the second signal terminal 3 in a circuit configuration. Note that, in the present application, the expression "in the(a) circuit configuration" is used to indicate not a layout in a physical configuration but a layout in a circuit diagram.

Arrangement of the first to fourth filters 10, 20, 30, and 40 will be described below in detail. The third filter 30 is provided between the first signal terminal 2 and the second signal terminal 3 in the circuit configuration. The fourth filter 40 is provided between the third filter 30 and the second signal terminal 3 in the circuit configuration. The first filter 10 and the second filter 20 are provided between the third filter 30 and the fourth filter 40 in the circuit configuration. In particular, in the present embodiment, the first to fourth filters 10, 20, 30, and 40 are connected in series in the order of the third filter 30 (high-pass filter), the first filter 10 (low-pass filter), the second filter 20 (low-pass filter), and then the fourth filter 40 (high-pass filter) from the first signal terminal 2 toward the second signal terminal 3.

The first to fourth filters 10, 20, 30, and 40 constitute a band-pass filter that selectively passes a signal of a frequency within a certain passband.

Next, an example of a circuit configuration of the filter device 1 will be described with reference to FIG. 1. The third filter 30 is connected to the first signal terminal 2. The third filter 30 includes a third inductor L31 and capacitors C31, C32, C33, C34, and C35.

One end of the capacitor C31 is connected to the first signal terminal 2. One end of the capacitor C32 is connected to the other end of the capacitor C31. One end of the capacitor C33 is connected to the one end of the capacitor C31. The other end of the capacitor C33 is connected to the other end of the capacitor C32.

One end of the third inductor L31 is connected to a connection point between the capacitor C31 and the capacitor C32. The capacitor C34 is connected in parallel with third inductor L31.

One end of the capacitor C35 is connected to the connection point between the capacitor C31 and the capacitor C32. The other end of the capacitor C35 is grounded.

The first filter 10 is connected to the third filter 30. The first filter 10 includes a first inductor L11 and capacitors C11 and C12. One end of each of the first inductor L11 and the capacitor C11 is connected to the other end of the capacitor C32 of the third filter 30. One end of the capacitor C12 is connected to the one end of the capacitor C11.

The second filter 20 is connected to the first filter 10. The second filter 20 includes a second inductor L21 and capacitors C21 and C22. One end of the second inductor L21 is connected to the other end of the first inductor L11 of the first filter 10. One end of the capacitor C21 is connected to the other end of the capacitor C11 of the first filter 10. One end of the capacitor C22 is connected to the other end of the capacitor C21.

The filter device 1 further includes an inductor L1 and the capacitor C1. One end of the inductor L1 is connected to a connection point between the first inductor L11 and the second inductor L21. The other end of the inductor L1 is connected to a connection point between the capacitor C11 and the capacitor C21. One end of the capacitor C1 is connected to the other end of the inductor L1. The other end of the capacitor C1 is grounded.

The fourth filter 40 is connected to the second filter 20 and the second signal terminal 3. The fourth filter 40 includes a fourth inductor L41 and capacitors C41, C42, C43, C44, and C45.

One end of the capacitor C41 is connected to the other end of the second inductor L21 of the second filter 20. One end of the capacitor C42 is connected to the other end of the capacitor C41. The other end of the capacitor C42 is connected to the second signal terminal 3. One end of the capacitor C43 is connected to the one end of the capacitor C41. The other end of the capacitor C43 is connected to the other end of the capacitor C42.

One end of the fourth inductor L41 is connected to a connection point between the capacitor C41 and the capacitor C42. The capacitor C44 is connected in parallel with fourth inductor L41.

One end of the capacitor C45 is connected to the connection point between the capacitor C41 and the capacitor C42. The other end of the capacitor C45 is grounded.

The filter device 1 further includes an inductor L2. One end of the inductor L2 is connected to the other end of each of the third and fourth inductors L31 and L41. The other end of the inductor L2 is grounded.

In the example shown in FIG. 1, the first filter 10 and the second filter 20 have circuit configurations symmetric with respect to the inductors L1 and L2 and the capacitor C1. Specifically, in the filter device 1, arrangements of the inductor and the capacitors included in the first filter 10 and the inductor and the capacitors included in the second filter 20 are symmetric with respect to the inductors L1 and L2 and the capacitor C1 in a circuit diagram.

Similarly, in the example shown in FIG. 1, the third filter 30 and the fourth filter 40 have circuit configurations symmetric with respect to the inductors L1 and L2 and the capacitor C1. Specifically, in the filter device 1, arrangements of the inductor and the capacitors included in the third filter 30 and the inductor and the capacitors included in the fourth filter 40 are symmetric with respect to the inductors L1 and L2 and the capacitor C1 in the circuit diagram.

Figure 2:
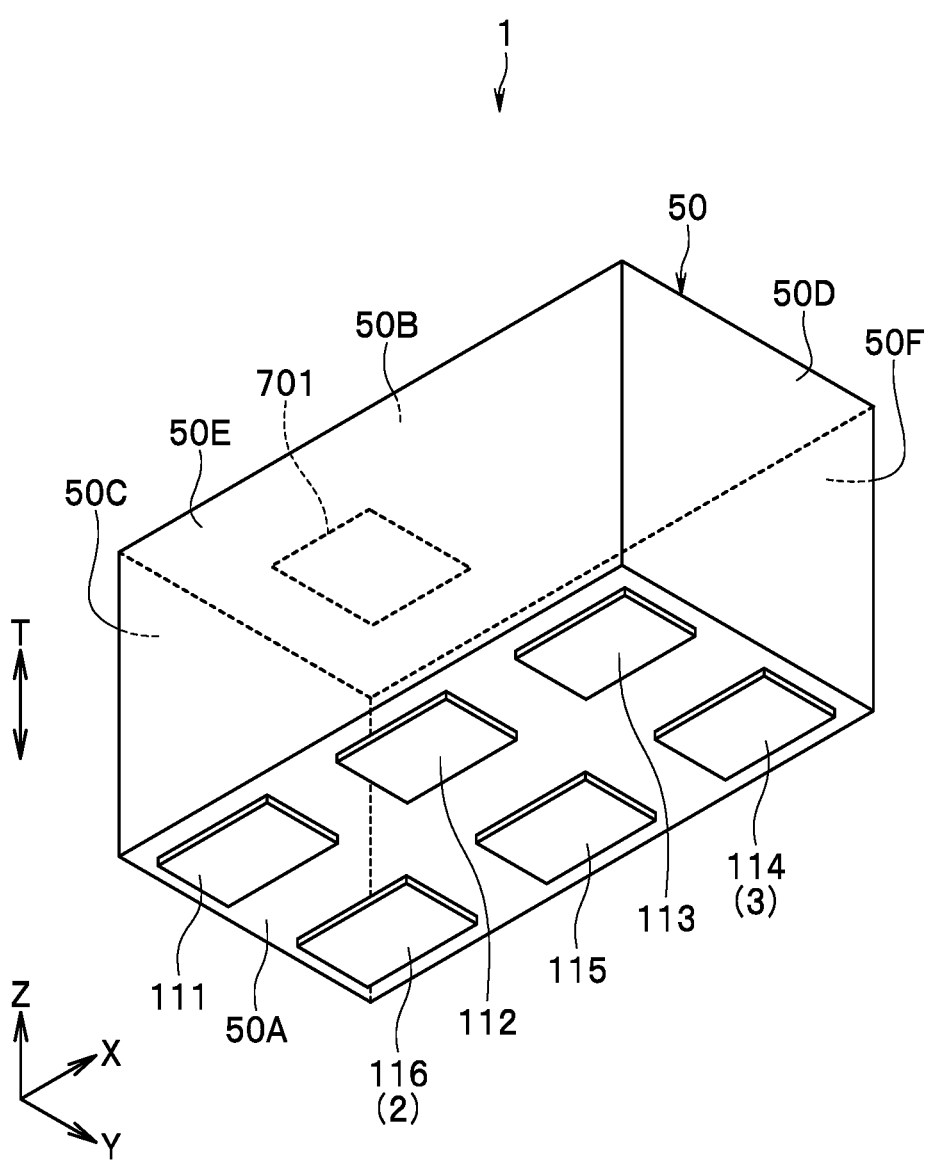
FIG. 2 is a perspective view showing an external appearance of the multilayered filter device according to the first embodiment of the present invention.

Next, other configurations of the filter device 1 will be described with reference to FIG. 2. FIG. 2 is a perspective view showing an external appearance of the filter device 1.

The filter device 1 further includes a stack 50 including a plurality of dielectric layers and a plurality of conductors (plurality of conductor layers and plurality of through holes) stacked together. The first signal terminal 2, the second signal terminal 3, the first to fourth filters 10, 20, 30, and 40, the inductors L1 and L2, and the capacitor C1 are integrated with the stack 50.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, as shown in FIG. 2, an X direction, a Y direction, and a Z direction are defined. The X direction, the Y direction, and the Z direction are orthogonal to one another. In the present embodiment, a direction parallel to the stacking direction T is defined as the Z direction. A direction opposite to the X direction is defined as a −X direction, a direction opposite to the Y direction is defined as a −Y direction, and a direction opposite to the Z direction is defined as a −Z direction. The expression of "when seen from the stacking direction T" means that an object is seen from a position away in the Z direction or the −Z direction.

As shown in FIG. 2, the bottom surface 50A is located at the end of the stack 50 in the −Z direction. The top surface 50B is located at the end of the stack 50 in the Z direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The filter device 1 further includes electrodes 111, 112, 113, 114, 115, and 116 disposed on the bottom surface 50A of the stack 50. The electrodes 111, 112, and 113 are arranged in this order in the X direction at a position closer to the side surface 50E than the side surface 50F. The electrodes 114, 115, and 115 are arranged in this order in the −X direction at a position closer to the side surface 50F than the side surface 50E.

The electrode 116 corresponds to the first signal terminal 2, and the electrode 114 corresponds to the second signal terminal 3. The first and second signal terminals 2 and 3 are thus disposed on the bottom surface 50A of the stack 50. Each of the electrodes 111 to 113 and 115 is grounded.

Next, an example of the plurality of dielectric layers and the plurality of conductors constituting the stack 50 will be described with reference to FIG. 3A to FIG. 6B. In the present example, the stack 50 includes twenty dielectric layers stacked together. The twenty dielectric layers are hereinafter referred to as first to twentieth dielectric layers in the order from bottom to top. The first to twentieth dielectric layers are denoted by reference numerals 51 to 70, respectively.

In FIG. 3A to FIG. 5C, each circle represents a through hole. The dielectric layers 51 to 68 each have a plurality of through holes. The plurality of through holes are each formed by filling a hole intended for a through hole with a conductive paste. Each of the plurality of through holes is connected to an electrode, a conductor layer, or another through hole. For a connection relationship between each of the plurality of through holes and an electrode, a conductor layer, or another through hole, the connection relationship in a state where the first to twentieth dielectric layers 51 to 70 are stacked together is described.

Figure 3A:
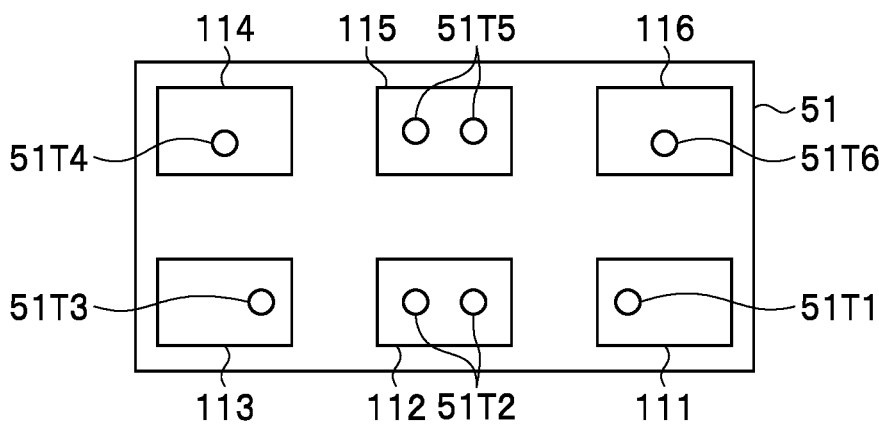
FIG. 3A to FIG. 3C are explanatory diagrams showing respective patterned surfaces of first to third dielectric layers of a stack of the multilayered filter device according to a first embodiment of the present invention.

FIG. 3A shows a patterned surface of the first dielectric layer 51. The electrodes 111 to 116 are formed on the patterned surface of the dielectric layer 51. Through holes 51T1, 51T3, 51T4, and 51T6 connected respectively to the electrodes 111, 113, 114, and 116, two through holes 51T2 connected to the electrode 112, and two through holes 51T5 connected to the electrode 115 are formed in the dielectric layer 51.

Figure 3B:
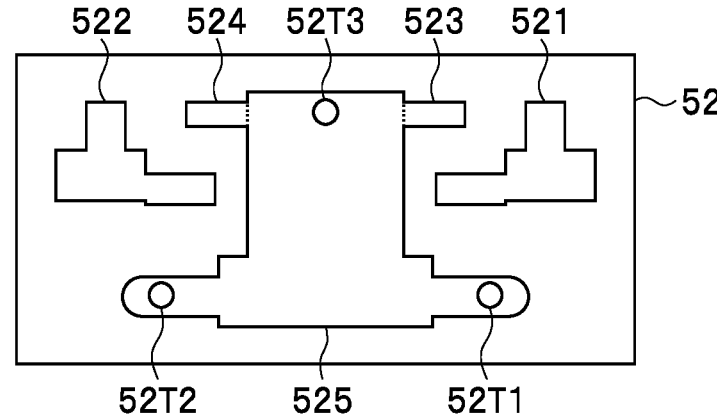

FIG. 3B shows a patterned surface of the second dielectric layer 52. Conductor layers 521, 522, 523, 524, and 525 are formed on the patterned surface of the dielectric layer 52. The conductor layers 523 and 524 are connected to the conductor layer 525. In FIG. 3B, each of a boundary between the conductor layer 523 and the conductor layer 525 and a boundary between the conductor layer 524 and the conductor layer 525 is indicated by a dotted line. The through hole 51T4 is connected to the conductor layer 522. The through hole 51T6 is connected to the conductor layer 521.

Through holes 52T1, 52T2, and 52T3 are formed in the dielectric layer 52. The through holes 51T1 to 51T3, 51T5, and 52T1 to 52T3 are connected to the conductor layer 523.

Figure 3C:
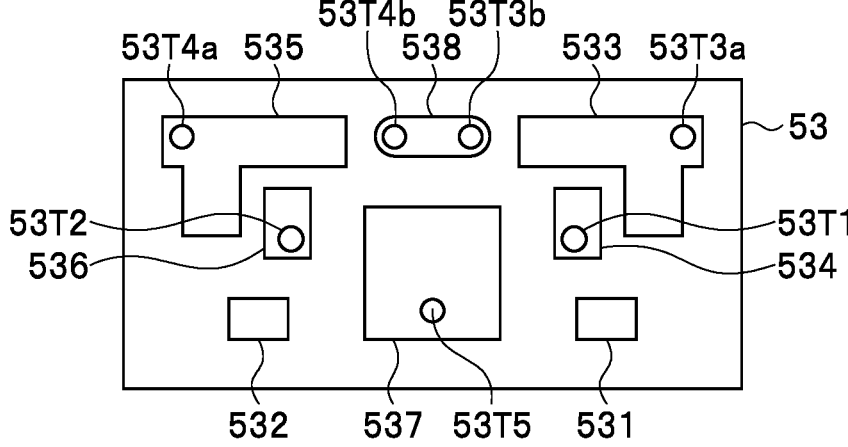

FIG. 3C shows a patterned surface of the third dielectric layer 53. Conductor layers 531, 532, 533, 534, 535, 536, 537, and 538 are formed on the patterned surface of the dielectric layer 53. The through holes 52T1 and 52T2 are connected respectively to the conductor layers 531 and 532.

Through holes 53T1, 53T2, 53T3a, 53T3b, 53T4a, 53T4b, and 53T5 are formed in the dielectric layer 53. The through holes 53T1, 53T2, and 53T5 are connected respectively to the conductor layers 534, 536, and 537. The through holes 53T3a and 53T4a are connected respectively to the conductor layers 533 and 535. The through holes 52T3, 53T3b, and 53T4b are connected to the conductor layer 538.

Figure 4A:
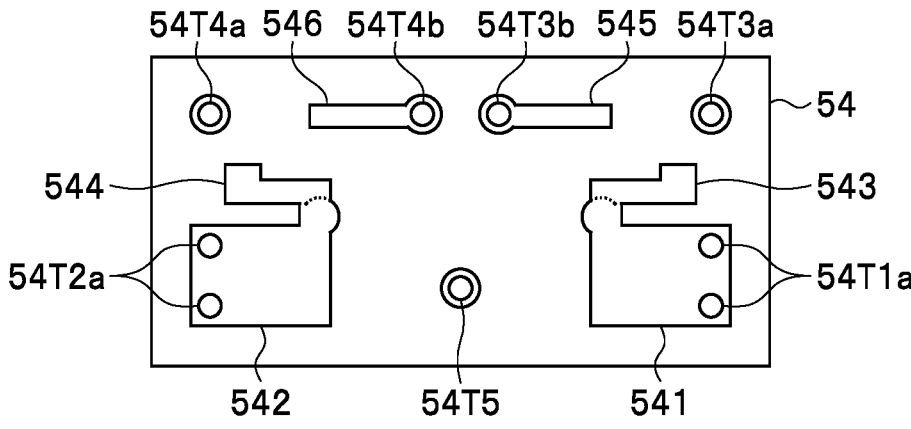
FIG. 4A to FIG. 4C are explanatory diagrams showing respective patterned surfaces of fourth to sixth dielectric layers of the stack of the multilayered filter device according to the first embodiment of the present invention.

FIG. 4A shows a patterned surface of the fourth dielectric layer 54. Conductor layers 541, 542, 543, 544, 545, and 546 are formed on the patterned surface of the dielectric layer 54. The conductor layer 543 is connected to the conductor layer 541. The conductor layer 544 is connected to the conductor layer 542. In FIG. 4A, each of a boundary between the conductor layer 541 and the conductor layer 543 and a boundary between the conductor layer 542 and the conductor layer 544 is indicated by a dotted line.

Two through holes 54T1a, two through holes 54T2a, and through holes 54T3a, 54T3b, 54T4a, 54T4b, and 54T5 are formed in the dielectric layer 54. The two through holes 54T1*a* are connected to the conductor layer 541. The two through holes 54T2*a* are connected to the conductor layer 542. The through holes 53T3*a*, 53T4*a*, and 53T5 are connected respectively to the through holes 54T3*a*, 54T4*a*, and 54T5. The through holes 53T3*b* and 54T3*b* are connected to the conductor layer 545. The through holes 53T4*b* and 54T4*b* are connected to the conductor layer 546.

Figure 4B:
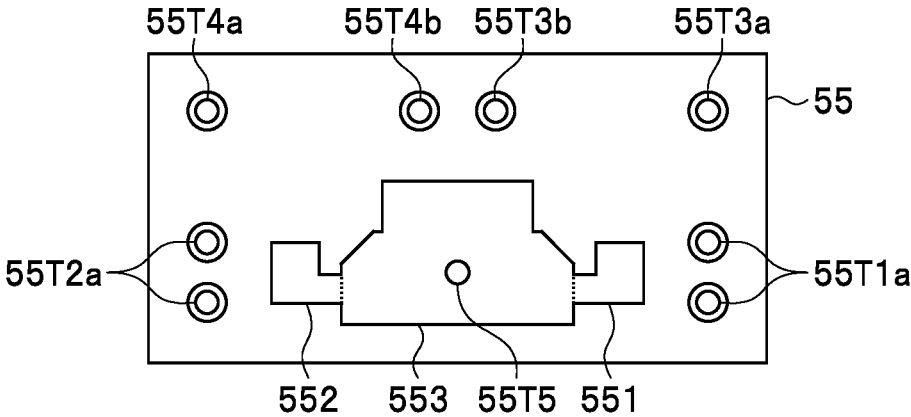

FIG. 4B shows a patterned surface of the fifth dielectric layer 55. Conductor layers 551, 552, and 553 are formed on the patterned surface of the dielectric layer 55. The conductor layers 551 and 552 are connected to the conductor layer 553. In FIG. 4B, each of a boundary between the conductor layer 551 and the conductor layer 553 and a boundary between the conductor layer 552 and the conductor layer 553 is indicated by a dotted line.

The two through holes 55T1*a*, two through holes 55T2*a*, and through holes 55T3*a*, 55T3*b*, 55T4*a*, 55T4*b*, and 55T5 are formed in the dielectric layer 55. The through holes 54T1*a*, 54T2*a*, 54T3*a*, 54T3*b*, 54T4*a*, and 54T4*b* are connected respectively to the through holes 55T1*a*, 55T2*a*, 55T3*a*, 55T3*b*, 55T4*a*, and 55T4*b*. The through holes 54T5 and 55T5 are connected to the conductor layer 553.

Figure 4C:
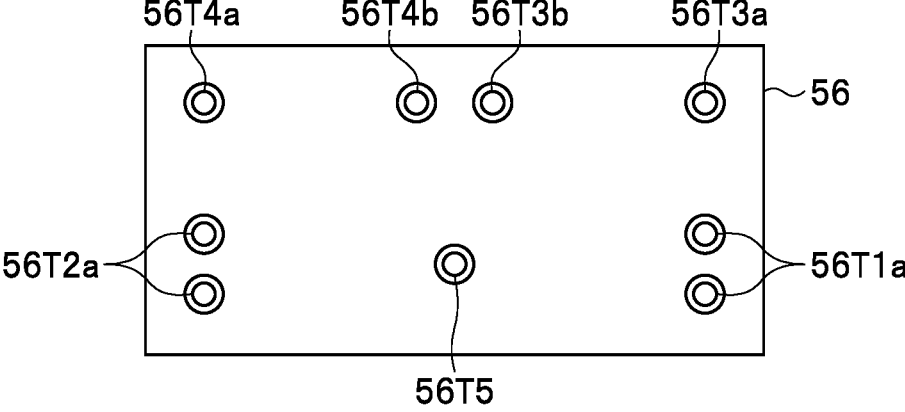

FIG. 4C shows a patterned surface of the sixth dielectric layer 56. Two through holes 56T1*a*, two through holes 56T2*a*, and through holes 56T3*a*, 56T3*b*, 56T4*a*, 56T4*b*, and 56T5 are formed in the dielectric layer 56. The through holes 55T1*a*, 55T2*a*, 55T3*a*, 55T3*b*, 55T4*a*, 55T4*b*, and 55T5 are connected respectively to the through holes 56T1*a*, 56T2*a*, 56T3*a*, 56T3*b*, 56T4*a*, 56T4*b*, and 56T5.

Figure 5A:
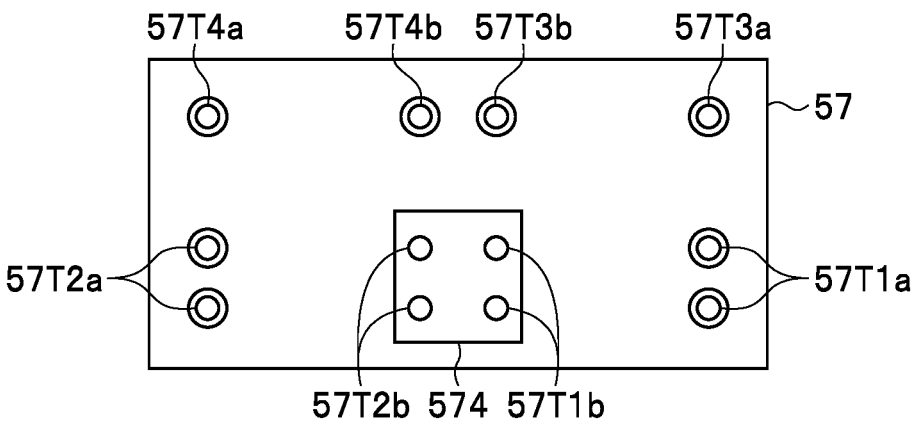
FIG. 5A is an explanatory diagram showing a patterned surface of a seventh dielectric layer of the stack of the multilayered filter device according to the first embodiment of the present invention.

FIG. 5A shows a patterned surface of the seventh dielectric layer 57. A conductor layer 574 is formed on the patterned surface of the dielectric layer 57. Two through holes 57T1*a*, two through holes 57T1*b*, two through holes 57T2*a*, two through holes 57T2*b*, and through holes 57T3*a*, 57T3*b*, 57T4*a*, and 57T4*b* are formed in the dielectric layer 57. The through holes 56T1*a*, 56T2*a*, 56T3*a*, 56T3*b*, 56T4*a*, and 56T4*b* are connected respectively to the through holes 57T1*a*, 57T2*a*, 57T3*a*, 57T3*b*, 57T4*a*, and 57T4*b*. The through hole 56T5, the two through holes 57T1*b*, and the two through holes 57T2*b* are connected to the conductor layer 574.

Figure 5B:
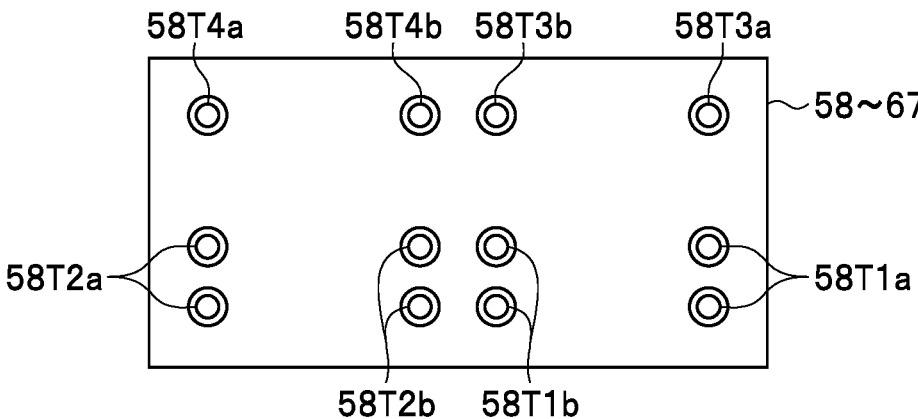
FIG. 5B is an explanatory diagram showing a patterned surface of each of eighth to seventeenth dielectric layers of the stack of the multilayered filter device according to the first embodiment of the present invention.

FIG. 5B shows a patterned surface of each of the eighth to seventeenth dielectric layers 58 to 67. Two through holes 58T1*a*, two through holes 58T1*b*, two through holes 58T2*a*, two through holes 58T2*b*, and through holes 58T3*a*, 58T3*b*, 58T4*a*, and 58T4*b* are formed in each of the dielectric layers 58 to 67. The through holes 57T1*a*, 57T1*b*, 57T2*a*, 57T2*b*, 57T3*a*, 57T3*b*, 57T4*a*, and 57T4*b* are connected respectively to the through holes 58T1*a*, 58T1*b*, 58T2*a*, 58T2*b*, 58T3*a*, 58T3*b*, 58T4*a*, and 58T4*b* formed in the dielectric layer 58. In the dielectric layers 58 to 67, every vertically adjacent through holes denoted by the same reference signs are connected to each other.

Figure 5C:
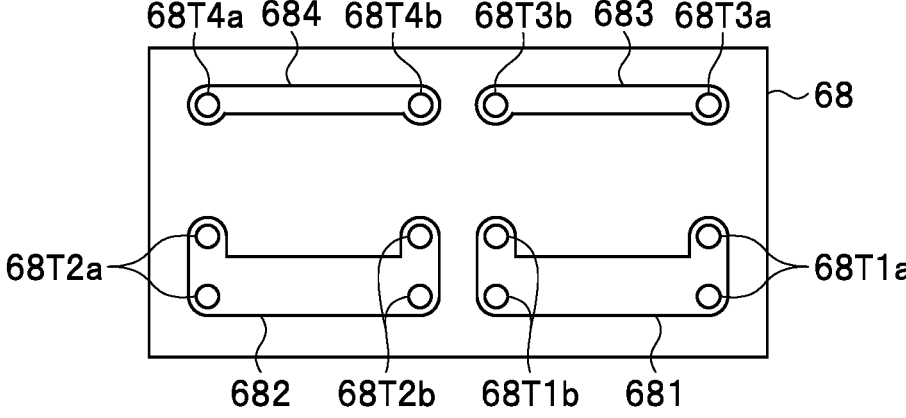
FIG. 5C is an explanatory diagram showing a patterned surface of an eighteenth dielectric layer of the stack of the multilayered filter device according to the first embodiment of the present invention.

FIG. 5C shows a patterned surface of the eighteenth dielectric layer 68. Inductor conductor layers 681, 682, 683, and 684 are formed on the patterned surface of the dielectric layer 68. The conductor layer 681 has a first end and a second end located at both ends of the conductor layer 681 in a longitudinal direction. The conductor layer 682 has a first end and a second end located at both ends of the conductor layer 682 in a longitudinal direction. The conductor layer 683 has a first end and a second end located at both ends of the conductor layer 683 in a longitudinal direction. The conductor layer 684 has a first end and a second end located at both ends of the conductor layer 684 in a longitudinal direction.

Two through holes 68T1*a*, two through holes 68T1*b*, two through holes 68T2*a*, two through holes 68T2*b*, and through holes 68T3*a*, 68T3*b*, 68T4*a*, and 68T4*b* are formed in the dielectric layer 68.

The two through holes 58T1*a* formed in the dielectric layer 67 and the two through holes 68T1*a* are connected to a portion near the first end of the conductor layer 681. The two through holes 58T1*b* formed in the dielectric layer 67 and the two through holes 68T1*b* are connected to a portion near the second end of the conductor layer 681.

The two through holes 58T2*a* formed in the dielectric layer 67 and the two through holes 68T2*a* are connected to a portion near the first end of the conductor layer 682. The two through holes 58T2*b* formed in the dielectric layer 67 and the two through holes 68T2*b* are connected to a portion near the second end of the conductor layer 682.

The through hole 58T3*a* formed in the dielectric layer 67 and the through hole 68T3*a* are connected to a portion near the first end of the conductor layer 683. The through hole 58T3*b* formed in the dielectric layer 67 and the through hole 68T3*b* are connected to a portion near the second end of the conductor layer 683.

The through hole 58T4*a* formed in the dielectric layer 67 and the through hole 68T4*a* are connected to a portion near the first end of the conductor layer 684. The through hole 58T4*b* formed in the dielectric layer 67 and the through hole 68T4*b* are connected to a portion near the second end of the conductor layer 684.

Figure 6A:
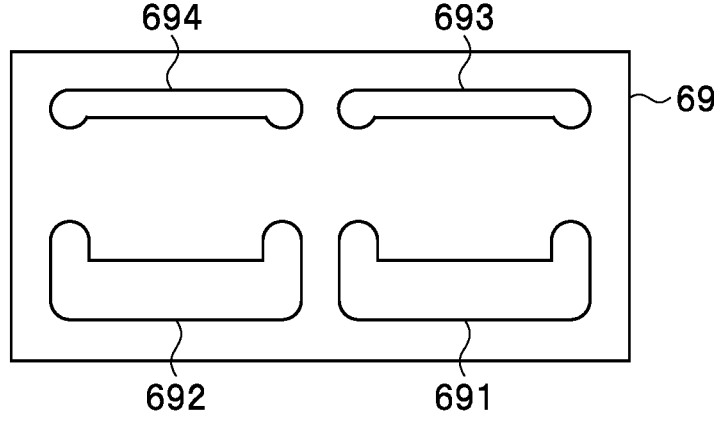
FIG. 6A and FIG. 6B are explanatory diagrams showing respective patterned surfaces of nineteenth and twentieth dielectric layers of the stack of the multilayered filter device according to the first embodiment of the present invention.

FIG. 6A shows a patterned surface of the nineteenth dielectric layer 69. Inductor conductor layers 691, 692, 693, and 694 are formed on the patterned surface of the dielectric layer 69. The conductor layer 691 has a first end and a second end located at both ends of the conductor layer 691 in a longitudinal direction. The conductor layer 692 has a first end and a second end located at both ends of the conductor layer 692 in a longitudinal direction. The conductor layer 693 has a first end and a second end located at both ends of the conductor layer 693 in a longitudinal direction. The conductor layer 694 has a first end and a second end located at both ends of the conductor layer 694 in a longitudinal direction.

The two through holes 68T1*a* are connected to a portion near the first end of the conductor layer 691. The two through holes 68T1*b* are connected to a portion near the second end of the conductor layer 691.

The two through holes 68T2*a* are connected to a portion near the first end of the conductor layer 692. The two through holes 68T2*b* are connected to a portion near the second end of the conductor layer 692.

The through hole 68T3*a* is connected to a portion near the first end of the conductor layer 693. The through hole 68T3*b* is connected to a portion near the second end of the conductor layer 693.

The through hole 68T4*a* is connected to a portion near the first end of the conductor layer 694. The through hole 69T4*b* is connected to a portion near the second end of the conductor layer 694.

Figure 6B:
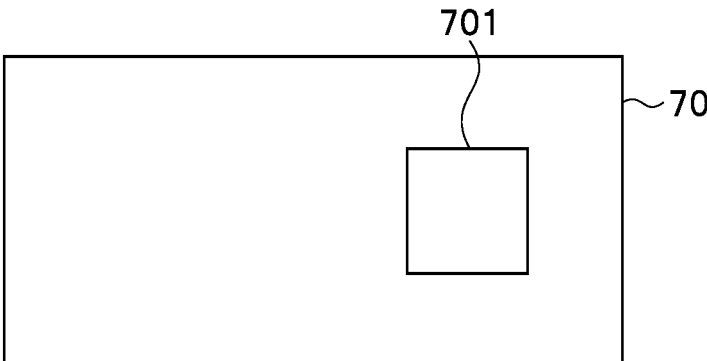

FIG. 6B shows a patterned surface of the twentieth dielectric layer 70. A mark 701 is formed on the patterned surface of the dielectric layer 70.

The stack 50 shown in FIG. 2 is formed by stacking the first to twentieth dielectric layers 51 to 70 such that the patterned surface of the first dielectric layer 51 serves as the bottom surface 50A of the stack 50 and the surface of the twentieth dielectric layer 70 opposite to the patterned surface thereof serves as the top surface 50B of the stack 50.

Figure 7:
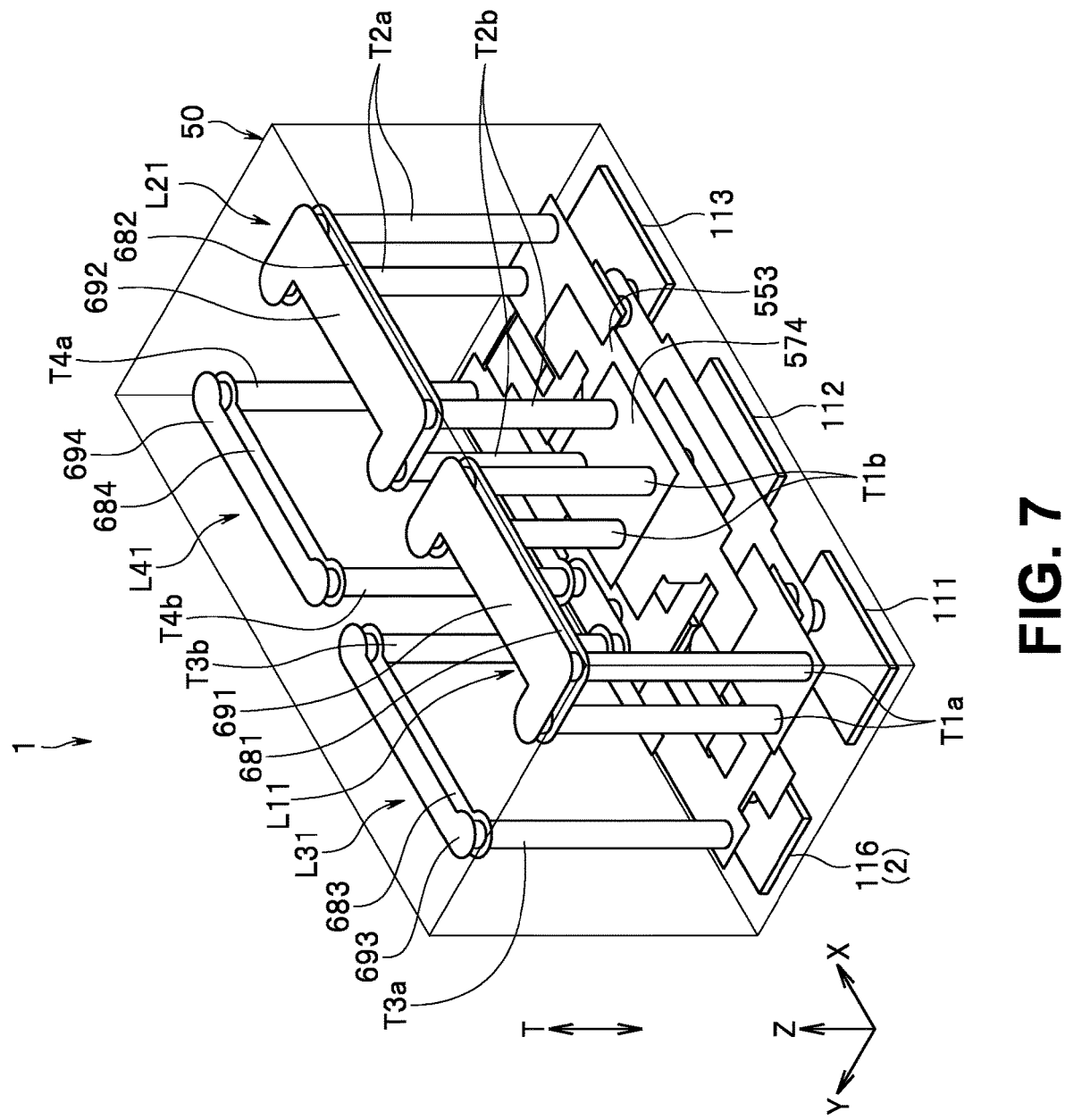
FIG. 7 is a perspective view showing an internal structure of the stack of the multilayered filter device according to the first embodiment of the present invention.

FIG. 7 shows an internal structure of the stack 50 formed by stacking the first to twentieth dielectric layers 51 to 70. As shown in FIG. 7, the plurality of conductor layers and the plurality of through holes shown in FIG. 3A to FIG. 6A are stacked inside the stack 50. In FIG. 7, the mark 701 is omitted.

A correspondence between circuit components of the filter device 1 shown in FIG. 1 and internal components of the stack 50 shown in FIG. 3A to FIG. 6A will now be described. Components of the first filter 10 will initially be described. The first inductor L11 is composed of the inductor conductor layers 681 and 691 and the through holes 54T1a, 55T1a, 56T1a, 57T1a, 57T1b, 58T1a, 58T1b, 68T1a, and 68T1b.

The capacitor C11 is composed of the conductor layers 541 and 551 and the dielectric layer 54 between those conductor layers. The capacitor C12 is composed of the conductor layers 531 and 541 and the dielectric layer 53 between those conductor layers.

Next, components of the second filter 20 will be described. The second inductor L21 is composed of the inductor conductor layers 682 and 692 and the through holes 54T2a, 55T2a, 56T2a, 57T2a, 57T2b, 58T2a, 58T2b, 68T2a, and 68T2b.

The capacitor C21 is composed of the conductor layers 542 and 552 and the dielectric layer 54 between those conductor layers. The capacitor C22 is composed of the conductor layers 532 and 542 and the dielectric layer 53 between those conductor layers.

Next, components of the third filter 30 will be described. The third inductor L31 is composed of the inductor conductor layers 683 and 693 and the through holes 53T3a, 54T3a, 54T3b, 55T3a, 55T3b, 56T3a, 56T3b, 57T3a, 57T3b, 58T3a, 58T3b, 68T3a, and 68T3b.

The capacitor C31 is composed of the conductor layers 521 and 533 and the dielectric layer 52 between those conductor layers. The capacitor C32 is composed of the conductor layers 533 and 543 and the dielectric layer 53 between those conductor layers. The capacitor C33 is composed of the conductor layers 521 and 534 and the dielectric layer 52 between those conductor layers.

The capacitor C34 is composed of the conductor layers 533 and 545 and the dielectric layer 53 between those conductor layers. The capacitor C35 is composed of the conductor layers 523 and 533 and the dielectric layer 52 between those conductor layers.

Next, components of the fourth filter 40 will be described. The fourth inductor L41 is composed of the inductor conductor layers 684 and 694 and the through holes 53T4a, 54T4a, 54T4b, 55T4a, 55T4b, 56T4a, 56T4b, 57T4a, 57T4b, 58T4a, 58T4b, 68T4a, and 68T4b.

The capacitor C41 is composed of the conductor layers 535 and 544 and the dielectric layer 53 between those conductor layers. The capacitor C42 is composed of the conductor layers 522 and 535 and the dielectric layer 52 between those conductor layers. The capacitor C43 is composed of the conductor layers 522 and 536 and the dielectric layer 52 between those conductor layers.

The capacitor C44 is composed of the conductor layers 535 and 546 and the dielectric layer 53 between those conductor layers. The capacitor C45 is composed of the conductor layers 524 and 535 and the dielectric layer 52 between those conductor layers.

Next, the inductors L1 and L2 and the capacitor C1 will be described. The inductor L1 is formed by the through holes 55T5 and 56T5. The inductor L2 is formed by the through holes 52T3. The capacitor C1 is composed of the conductor layers 525 and 537 and the dielectric layer 52 between those conductor layers.

Next, structural characteristics of the filter device 1 according to the present embodiment will be described with reference to FIG. 1 to FIG. 7. Each of the first inductor L11 of the first filter 10, the second inductor L21 of the second filter 20, the third inductor L31 of the third filter 30, and the fourth inductor L41 of the fourth filter 40 is also a rectangular or approximately rectangular winding. For the rectangular or approximately rectangular winding, the number of windings may be counted, when the winding is regarded as a rectangle, as ¼, per side of the rectangle. The number of windings of each of the first to fourth inductors L11, L21, L31, and L41 is ¾ or more. In the present embodiment, each of the first to fourth inductors L11, L21, L31, and L41 is wound ¾ times around an axis orthogonal to the stacking direction T. The above-described axis may be an axis extending in a direction parallel to the Y direction or may be an axis extending in a direction inclined with respect to a direction parallel to the Y direction.

As employed herein, a structure formed by connecting two or more through holes in series will be referred to as a through hole line. The first inductor L11 includes two through hole lines T1a, two through hole lines T1b, the conductor layer 681 connected to one end of each of the two through hole lines T1a and one end of each of the two through hole lines T1b. The two through hole lines T1a are formed by the through holes 54T1a, 55T1a, 56T1a, 57T1a, and 58T1a being connected in series. The two through hole lines T1b are formed by the through holes 57T1b and 58T1b being connected in series. The first inductor L11 further includes the conductor layer 691 and through holes 68T1a and 68T1b electrically connecting the conductor layer 681 and the conductor layer 691.

The second inductor L21 includes two through hole lines T2a, two through hole lines T2b, and the conductor layer 682 connected to one end of each of the two through hole lines T2a and one end of each of the two through hole lines T2b. The two through hole lines T2a are formed by the through holes 54T2a, 55T2a, 56T2a, 57T2a, and 58T2a being connected in series. The two through hole lines T2b are formed by the through holes 57T2b and 58T2b being connected in series. The second inductor L21 further includes the conductor layer 692 and the through holes 68T2a and 68T2b electrically connecting the conductor layer 682 and the conductor layer 692.

The third inductor L31 includes a through hole line T3a, a through hole line T3b, and the conductor layer 683 connected to one end of the through hole line T3a and one end of the through hole line T3b. The through hole line T3a is formed by the through holes 53T3a, 54T3a, 55T3a, 56T3a, 57T3a, and 58T3a being connected in series. The through hole line T3b is formed by the through holes 54T3b, 55T3b, 56T3b, 57T3b, and 58T3b being connected in series. The third inductor L31 further includes the conductor layer 693 and the through holes 68T3a and 68T3b electrically connecting the conductor layer 683 and the conductor layer 693.

The fourth inductor L41 includes a through hole line T4a, a through hole line T4b, and the conductor layer 684 connected to one end of the through hole line T4a and one end of the through hole line T4b. The through hole line T4a is formed by the through holes 53T4a, 54T4a, 55T4a, 56T4a, 57T4a, and 58T4a being connected in series. The through hole line T4b is formed by the through holes 54T4b, 55T4b, 56T4b, 57T4b, and 58T4b being connected in series.

The fourth inductor L41 further includes the conductor layer 694 and the through holes 68T4a and 68T4b electrically connecting the conductor layer 684 and the conductor layer 694.

The first inductor L11 has an opening surrounded by the two through hole lines T1a, the conductor layer 681, and the two through hole lines T1b. The second inductor L21 has an opening surrounded by the two through hole lines T2a, the conductor layer 682, and the two through hole lines T2b. The third inductor L31 has an opening surrounded by the through hole line T3a, the conductor layer 683, and the through hole line T3b. The fourth inductor L41 has an opening surrounded by the through hole line T4a, the conductor layer 684, and the through hole line T4b.

As shown in FIG. 7, the first to fourth inductors L11, L21, L31, and L41 are arranged to satisfy first to fourth requirements below. The first requirement is that the opening of the first inductor L11 and the opening of the third inductor L31 face each other. The second requirement is that the opening of the second inductor L21 and the opening of the fourth inductor L41 face each other. The third requirement is that the opening of the first inductor L11 and the opening of the second inductor L21 do not face each other. The fourth requirement is that the opening of the third inductor L31 and the opening of the fourth inductor L41 do not face each other.

In the present embodiment, the first inductor L11 and the third inductor L31 are arranged in a direction parallel to the Y direction so that the opening of the first inductor L11 and the opening of the third inductor L31 face each other (first requirement). The second inductor L21 and the fourth inductor L41 are arranged in a direction parallel to the Y direction so that the opening of the second inductor L21 and the opening of the fourth inductor L41 face each other (second requirement). The first inductor L11 and the second inductor L21 are arranged in a direction parallel to the X direction so that the opening of the first inductor L11 and the opening of the second inductor L21 do not face each other (third requirement). The third inductor L31 and the fourth inductor L41 are arranged in a direction parallel to the X direction so that the opening of the third inductor L31 and the opening of the fourth inductor L41 do not face each other (fourth requirement). In particular, in the present embodiment, the first to fourth inductors L11, L21, L31, and L41 are arranged counterclockwise in the order of the first inductor L11, the second inductor L21, the fourth inductor L41, and then the third inductor L31 when seen from the stacking direction T.

As shown in FIG. 1, one end portion of each of the first and second inductors L11 and L21 is connected to the inductor L1. Specifically, one end portion of each of the two through hole lines T1b of the first inductor L11 and one end portion of each of the two through hole lines T2b of the second inductor L21 are electrically connected to the through hole 56T5 forming the inductor L1 through the conductor layer 574.

As shown in FIG. 1, the inductor L1 is connected to the capacitor C1. One end portion of each of the two through hole lines T1b of the first inductor L11 and one end portion of each of the two through hole lines T2b of the second inductor L21 are electrically connected to the conductor layer 537 composing the capacitor C1, via the conductor layer 574, the through holes 56T5 and 55T5, the conductor layer 553, and the through holes 54T5 and 53T5.

As shown in FIG. 1, one end portion of each of the third and fourth inductors L31 and L41 is connected to the inductor L2. Specifically, the one end portion of the through hole line T3b of the third inductor L31 and the one end portion of the through hole line T4b of the fourth inductor L41 are electrically connected to the through hole 52T3 forming the inductor L2 through the through holes 53T3b and 53T4b and the conductor layer 538.

As shown in FIG. 1, the inductor L2 is grounded. The one end portion of the through hole line T3b of the third inductor L31 and the one end portion of the through hole line T4b of the fourth inductor L41 are electrically grounded via the through holes 53T3b and 53T4b, the conductor layer 538, the through hole 52T3, the conductor layer 525, the through holes 51T1 to 51T3, and 51T5 and the electrodes 111 to 113, and 115.

Next, operation and effects of the filter device 1 according to the present embodiment will be described. In the present embodiment, the first to fourth inductors L11, L21, L31, and L41 are arranged to satisfy the above-described first to fourth requirements. According to the present embodiment, in particular, by the third requirement, it is possible to prevent magnetic coupling between the first filter 10 and the second filter 20, each of which is a low-pass filter, from being too strong compared with a case where the opening of the first inductor L11 and the opening of the second inductor L21 face each other. Thus, according to the present embodiment, with at least one of the first inductor L11 and the second inductor L21, effects of adjustment of an attenuation pole formed on the high-frequency side of the passband can be relatively increased.

According to the present embodiment, in particular, by the fourth requirement, it is possible to prevent magnetic coupling between the third filter 30 and the fourth filter 40, each of which is a high-pass filter, from being too strong compared with a case where the opening of the third inductor L31 and the opening of the fourth inductor L41 face each other. With this, according to the present embodiment, with at least one of the third inductor L31 and the fourth inductor L41, effects of adjustment of an attenuation pole formed on the low-frequency side of the passband can be relatively increased.

According to the present embodiment, in particular, by the first and second requirements, it is possible to reduce a space for arranging the first to fourth inductors L11, L21, L31, and L41 while satisfying the third and fourth requirements. With this, according to the present embodiment, the stack 50, in other words, the filter device 1, can be miniaturized.

In view of the above, according to the present invention, it is possible to provide the filter device 1 that can be miniaturized while facilitating adjustment of characteristics.

In the present embodiment, the one end portion of each of the first inductor L11 and the second inductor L21 is connected to the inductor L1. According to the present embodiment, by the inductor L1, the strength of magnetic coupling between the first inductor L11 and the second inductor L21 can be adjusted. In the present embodiment, the first inductor L11 and the second inductor L21 are arranged in a direction parallel to the X direction. With this, according to the present embodiment, it is structurally easy to connect the one end portion of each of the first inductor L11 and the second inductor L21 to the inductor L1.

Note that, in the present embodiment, the first to fourth filters 10, 20, 30, and 40 are connected in series in the order of the third filter 30, the first filter 10, the second filter 20, and then the fourth filter 40 from the first signal terminal 2 toward the second signal terminal 3. If the first to fourth filters 10, 20, 30, and 40 are connected in series in the order of the first filter 10 (low-pass filter), the third filter 30 (high-pass filter), the fourth filter 40 (high-pass filter), and then the second filter 20 (low-pass filter) from the first signal terminal 2 toward the second signal terminal 3, a plurality of capacitors are provided in a path connecting the one end of the first inductor L11 and the other end of the second inductor L21. This prevents the inductor L1 electrically connected to the one end portion of each of the first inductor L11 and the second inductor L21 from being provided. The order of connection of the first to fourth filters 10, 20, 30, and 40 in the present embodiment is also a requirement for providing the inductor L1.

In the present embodiment, the one end portion of each of the third inductor L31 and the fourth inductor L41 is connected to the inductor L2. According to the present embodiment, by the inductor L2, the strength of magnetic coupling between the third inductor L31 and the fourth inductor L41 can be adjusted. In the present embodiment, the third inductor L31 and the fourth inductor L41 are arranged in a direction parallel to the X direction. With this, according to the present embodiment, it is structurally easy to connect the one end portion of each of the third inductor L31 and the fourth inductor L41 to the inductor L2.

Second Embodiment

Next, a second embodiment of the present invention will be described. In the present embodiment, the stack 50 of the filter device 1 includes fifth to seventh dielectric layers 155 to 157 instead of the fifth to seventh dielectric layers 55 to 57 in the first embodiment. The stack 50 in the present embodiment is formed by stacking the first to fourth dielectric layers 51 to 54 (refer to FIG. 3A to FIG. 4A), the fifth to seventh dielectric layers 155 to 157, and the eighth to twentieth dielectric layers 58 to 70 (refer to FIG. 5B to FIG. 6B).

A plurality of conductor layers and a plurality of through holes formed in each of the fifth to seventh dielectric layers 155 to 157 will be described below with reference to FIG. 8A and FIG. 8B.

Figure 8A:
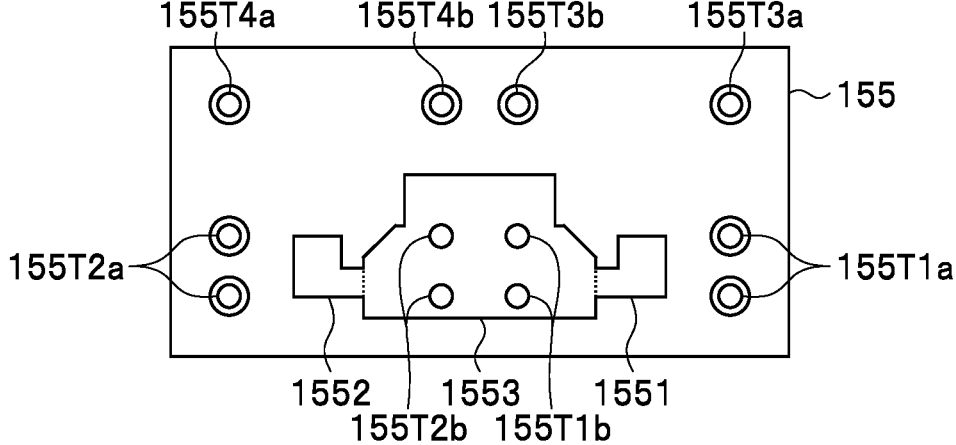
FIG. 8A is an explanatory diagram showing a patterned surface of a fifth dielectric layer of a stack of a multilayered filter device according to a second embodiment of the present invention.

FIG. 8A shows a patterned surface of the fifth dielectric layer 155. Conductor layers 1551, 1552, and 1553 are formed on the patterned surface of the dielectric layer 155. The conductor layers 1551 and 1552 are connected to the conductor layer 1553. In FIG. 8A, each of a boundary between the conductor layer 1551 and the conductor layer 1553 and a boundary between the conductor layer 1552 and the conductor layer 1553 is indicated by a dotted line.

Two through holes 155T1a, two through holes 155T1b, two through holes 155T2a, two through holes 155T2b, and through holes 155T3a, 155T3b, 155T4a, and 155T4b are formed in the dielectric layer 155. The through holes 54T1a, 54T2a, 54T3a, 54T3b, 54T4a, and 54T4b (refer to FIG. 4A) are connected respectively to the through holes 155T1a, 155T2a, 155T3a, 155T3b, 155T4a, and 154T4b. The through hole 54T5 (refer to FIG. 4A) and the through holes 155T1b and 155T2b are connected to the conductor layer 1553.

Figure 8B:
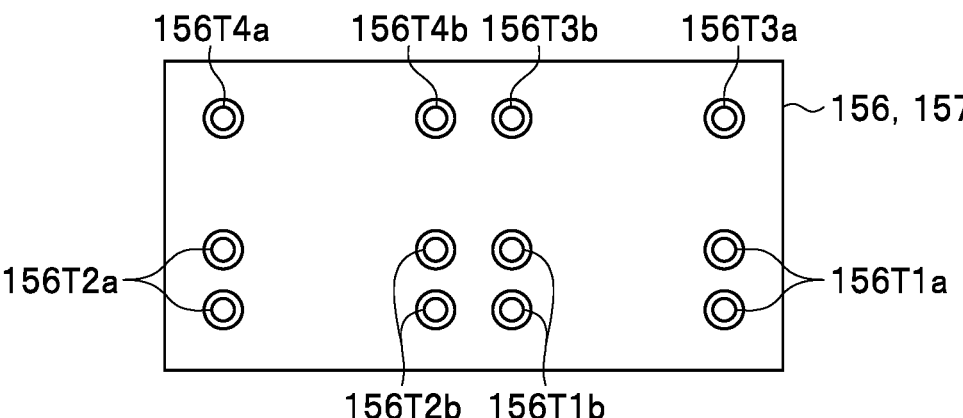
FIG. 8B is an explanatory diagram showing a patterned surface of each of sixth and seventh dielectric layers of the stack of the multilayered filter device according to the second embodiment of the present invention.

FIG. 8B shows a patterned surface of each of the sixth and seventh dielectric layers 156 and 157. Two through holes 156T1a, two through holes 156T1b, two through holes 156T2a, two through holes 156T2b, and through holes 156T3a, 156T3b, 156T4a, and 156T4b are formed in each of the dielectric layers 156 and 157. The through holes 155T1a, 155T1b, 155T2a, 155T2b, 155T3a, 155T3b, 155T4a, and 155T4b are connected respectively to the through holes 156T1a, 156T1b, 156T2a, 156T2b, 156T3a, 156T3b, 156T4a, and 156T4b formed in the dielectric layer 156. In the dielectric layers 156 and 157, every vertically adjacent through holes denoted by the same reference signs are connected to each other.

The through holes 156T1a, 156T1b, 156T2a, 156T2b, 156T3a, 156T3b, 156T4a, and 156T4b formed in the dielectric layer 157 are connected respectively to the through holes 58T1a, 58T1b, 58T2a, 58T2b, 58T3a, 58T3b, 58T4a, and 58T4b formed in the dielectric layer 58 (refer to FIG. 5B).

In the present embodiment, the capacitor C11 is composed by using the conductor layer 1551, instead of the conductor layer 551. The capacitor C21 is composed by using the conductor layer 1552, instead of the conductor layer 552.

Figure 9:
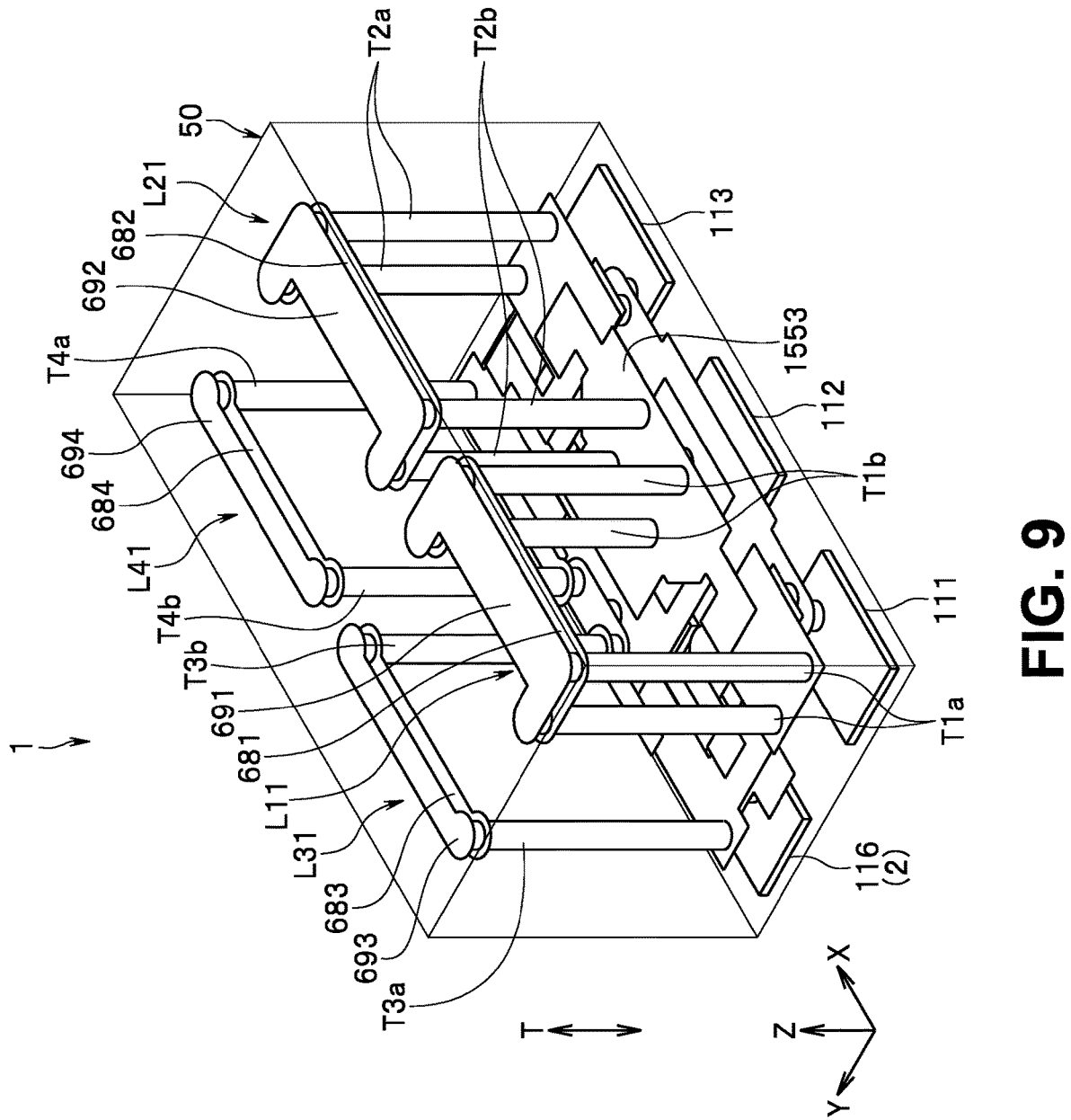
FIG. 9 is a perspective view showing an internal structure of the stack of the multilayered filter device according to the second embodiment of the present invention.

FIG. 9 is a perspective view showing an internal structure of the stack 50 in the present embodiment. In the present embodiment, the two through hole lines T1b of the first inductor L11 are formed by the through holes 155T1b, 156T1b, and 58T1b being connected in series. The two through hole lines T2b of the second inductor L21 are formed by the through holes 155T2b, 156T2b, and 58T2b being connected in series.

In the present embodiment, the inductor L1 shown in FIG. 1 in the first embodiment is not provided. One end of the capacitor C1 shown in FIG. 1 in the first embodiment is connected to the connection point between the first inductor L11 and the second inductor L21 and the connection point between the capacitor C11 and the capacitor C21. One end portion of each of the two through hole lines T1b of the first inductor L11 and one end portion of each of the two through hole lines T2b of the second inductor L21 are electrically connected to the conductor layer 537 composing the capacitor C1, via the conductor layer 1553 and the through holes 54T5 and 53T5 (refer to FIG. 3C, FIG. 4A, and FIG. 8A).

The configuration, operation, and effects of the present embodiment are otherwise the same as those of the first embodiment.

[Simulation]

Next, an example of characteristics of the filter device 1 will be described with reference to the result of a simulation. The simulation used a model of a first practical example and a model of a second practical example. The model of the first practical example is a model of the filter device 1 according to the first embodiment. The model of the second practical example is a model of the filter device 1 according to the second embodiment. In the simulation, pass attenuation characteristics were obtained for each of the model of the first practical example and the model of the second practical example.

Figure 10:
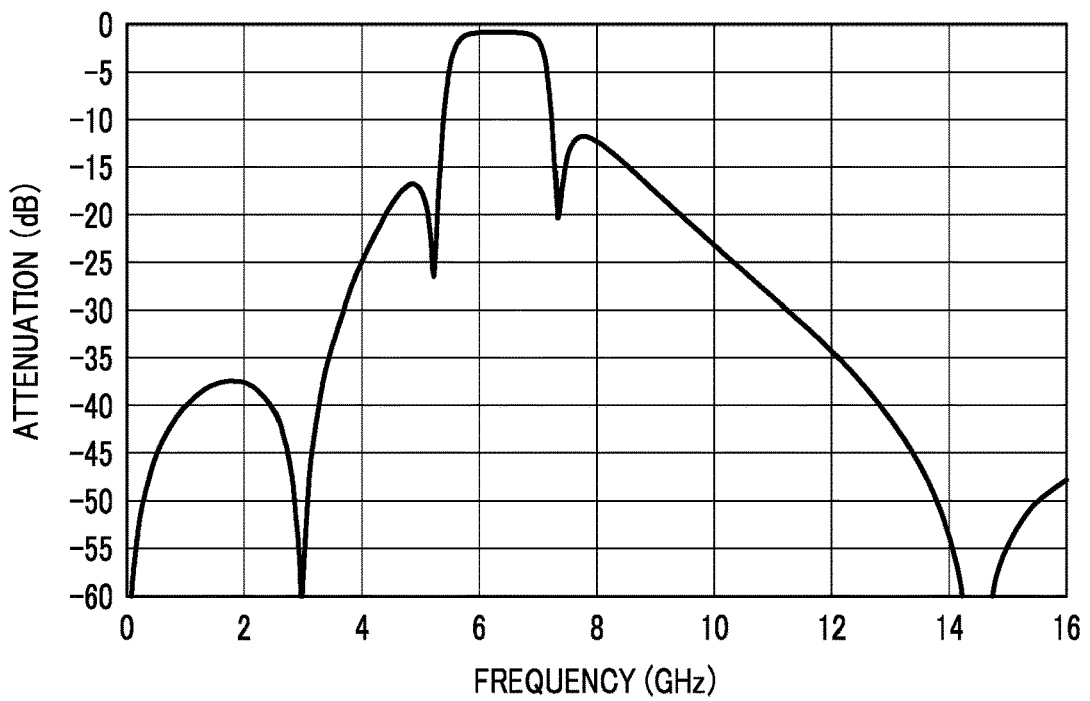
FIG. 10 is a characteristic chart showing an example of pass attenuation characteristics of a model of a first practical example.
Figure 11:
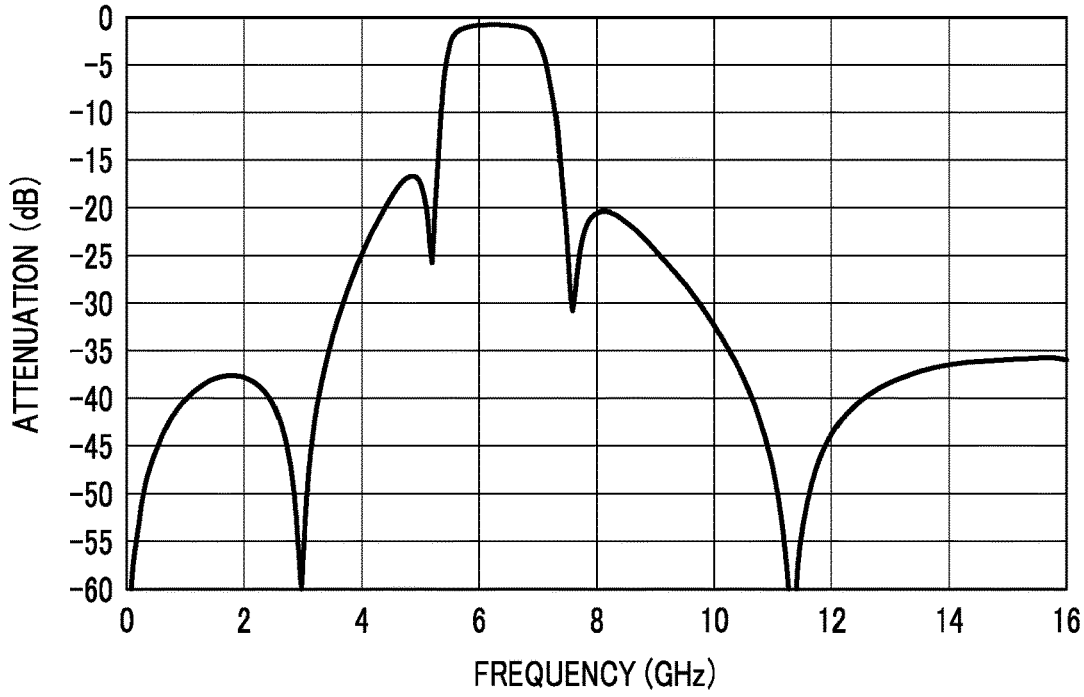
FIG. 11 is a characteristic chart showing an example of pass attenuation characteristics of a model of a second practical example.

FIG. 10 is a characteristic chart showing the pass attenuation characteristics of the model of the first practical example. FIG. 11 is a characteristic chart showing the pass attenuation characteristics of the model of the second practical example. In FIG. 10 and FIG. 11, the horizontal axis represents frequency, and the vertical axis represents attenuation. As shown in FIG. 10 and FIG. 11, the filter device 1 has excellent characteristics as a band-pass filter.

As shown in FIG. 10 and FIG. 11, the absolute value of attenuation of an attenuation pole closest to a passband on the high-frequency side of the passband is larger in the model of the second practical example. In the model of the second practical example, the inductor L1 is not provided. In other words, magnetic coupling between the first inductor L11 and the second inductor L21 in the model of the second practical example is suppressed compared with that in the model of the first practical model. As understood from the result, by the inductor L1, the magnetic coupling between the first inductor L11 and the second inductor L21 can be adjusted. Note that the magnetic coupling between the first inductor L11 and the second inductor L21 can also be adjusted by adjusting the number and shape of through holes forming the inductor L1, other than by presence/absence of the inductor L1. For example, by increasing in size of the inductor L1 in a direction parallel to the stacking direction T (reducing in size of the through hole lines T1b and T2b in the direction parallel to the stacking direction T), the magnetic coupling between the first inductor L11 and the second inductor L21 can be strengthened.

The above description of the inductor L1 also applies to the inductor L2. In other words, the magnetic coupling between the third inductor L31 and the fourth inductor L41 can be adjusted by the presence/absence of the inductor L2 or by adjusting the number and shape of through holes forming the inductor L2.

The present invention is not limited to the foregoing embodiments, and various modifications may be made thereto. For example, the configuration of each of the first to fourth filters 10, 20, 30, and 40 in the present invention can be any without being limited to the examples shown in each of the embodiments as long as satisfying the requirements of the claims.

The first to fourth filters 10, 20, 30, and 40 of the present invention may be part of a branching filter.

In the present invention, the first inductor L11 and the third inductor L31 may be arranged in a direction parallel to the X direction. In this case, the second inductor L21 and the fourth inductor L41 are arranged in a direction parallel to the X direction so as to satisfy the requirement that the opening of the first inductor L11 and the opening of the second inductor L21 do not face each other (third requirement) and the requirement that the opening of the third inductor L31 and the opening of the fourth inductor L41 do not face each other (fourth requirement). In other words, the first inductor L11 and the fourth inductor L41 are arranged in a direction parallel to the Y direction, and the second inductor L21 and the third inductor L31 are arranged in a direction parallel to the Y direction. In this case, the third inductor L31 substantially corresponds to a "fourth inductor" of the present invention, and the fourth inductor L41 substantially corresponds to a "third inductor" of the present invention.

As described above, a multilayered filter device of the present invention includes: a first filter which is a low-pass filter including a first inductor; a second filter which is a low-pass filter including a second inductor; a third filter which is a high-pass filter including a third inductor; a fourth filter which is a high-pass filter including a fourth inductor; and a stack for integrating the first filter, the second filter, the third filter, and the fourth filter, the stack including a plurality of dielectric layers stacked together. Each of the first inductor, the second inductor, the third inductor, and the fourth inductor is wound around an axis orthogonal to a stacking direction of the dielectric layers. The first inductor, the second inductor, the third inductor, and the fourth inductor are arranged in a manner that an opening of the first inductor and an opening of the third inductor face each other, an opening of the second inductor and an opening of the fourth inductor face each other, the opening of the first inductor and the opening of the second inductor do not face each other, and the opening of the third inductor and the opening of the fourth inductor do not face each other.

The multilayered filter device of the present invention may further include a first signal terminal and a second signal terminal each integrated with the stack. The third filter may be provided between the first signal terminal and the second signal terminal in a circuit configuration. The fourth filter may be provided between the third filter and the second signal terminal in the circuit configuration. The first filter and the second filter may be provided between the third filter and the fourth filter in the circuit configuration. The first filter, the second filter, the third filter, and the fourth filter may constitute a band-pass filter.

The multilayered filter device of the present invention may further include an inductor connected to one end portion of each of the first inductor and the second inductor. The multilayered filter device of the present invention may further include an inductor connected to one end portion of each of the third inductor and the fourth inductor.

In the multilayered filter device of the present invention, the first inductor and the second inductor may be arranged in a direction orthogonal to the stacking direction. In the multilayered filter device of the present invention, the third inductor and the fourth inductor may be arranged in a direction orthogonal to the stacking direction.

The multilayered filter device of the present invention may further include a capacitor including a plurality of capacitor conductor layers provided in the stack. Each of the first inductor and the second inductor may include a first through hole line, a second through hole line, and an inductor conductor layer electrically connected to one end of the first through hole line and one end of the second through hole line. Each of the first through hole line and the second through hole line may be formed by a plurality of through holes being connected in series. The other end of the second through hole line of the first inductor and the other end of the second through hole line of the second inductor may be electrically connected to one capacitor conductor layer of the plurality of capacitor conductor layers. The multilayered filter device of the present invention may further include: a conductor layer electrically connected to the other end of the second through hole line of the first inductor and the other end of the second through hole line of the second inductor; and at least one through hole electrically connecting the conductor layer and the one capacitor conductor layer.

In the multilayered filter device of the present invention, each of the third inductor and the fourth inductor may include a first through hole line, a second through hole line, and an inductor conductor layer electrically connected to one end of the first through hole line and one end of the second through hole line. Each of the first through hole line and the second through hole line may be formed by a plurality of through holes being connected in series. The multilayered filter device of the present invention may further include: a conductor layer electrically connected to the other end of the second through hole line of the third inductor and the other end of the second through hole line of the fourth inductor; and at least one through hole electrically connecting the conductor layer and the ground.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:
1. A multilayered filter device comprising:
a first filter which is a low-pass filter including a first inductor;
a second filter which is a low-pass filter including a second inductor;
a third filter which is a high-pass filter including a third inductor;

a fourth filter which is a high-pass filter including a fourth inductor; and a stack for integrating the first filter, the second filter, the third filter, and the fourth filter, the stack including a plurality of dielectric layers stacked together, wherein each of the first inductor, the second inductor, the third inductor, and the fourth inductor is wound around an axis orthogonal to a stacking direction of the dielectric layers, the first inductor, the second inductor, the third inductor, and the fourth inductor are arranged in a manner that an opening of the first inductor and an opening of the third inductor face each other, an opening of the second inductor and an opening of the fourth inductor face each other, the opening of the first inductor and the opening of the second inductor do not face each other, and the opening of the third inductor and the opening of the fourth inductor do not face each other, and the first filter and the second filter are provided between the third filter and the fourth filter in a circuit configuration.

2. The multilayered filter device according to claim 1, further comprising a first signal terminal and a second signal terminal each integrated with the stack, wherein the third filter is provided between the first signal terminal and the second signal terminal in the circuit configuration, and the fourth filter is provided between the third filter and the second signal terminal in the circuit configuration.

3. The multilayered filter device according to claim 2, wherein the first filter, the second filter, the third filter, and the fourth filter constitute a band-pass filter.

4. The multilayered filter device according to claim 1, further comprising an inductor connected to one end portion of each of the first inductor and the second inductor.

5. The multilayered filter device according to claim 1, further comprising an inductor connected to one end portion of each of the third inductor and the fourth inductor.

6. The multilayered filter device according to claim 1, wherein the first inductor and the second inductor are arranged in a direction orthogonal to the stacking direction.

7. The multilayered filter device according to claim 1, wherein the third inductor and the fourth inductor are arranged in a direction orthogonal to the stacking direction.

8. The multilayered filter device according to claim 1, further comprising a capacitor including a plurality of capacitor conductor layers provided in the stack, wherein each of the first inductor and the second inductor includes a first through hole line, a second through hole line, and an inductor conductor layer electrically connected to one end of the first through hole line and one end of the second through hole line, each of the first through hole line and the second through hole line is formed by a plurality of through holes being connected in series, and another end of the second through hole line of the first inductor and another end of the second through hole line of the second inductor are electrically connected to one capacitor conductor layer of the plurality of capacitor conductor layers.

9. The multilayered filter device according to claim 8, further comprising:

a conductor layer electrically connected to the other end of the second through hole line of the first inductor and the other end of the second through hole line of the second inductor; and at least one through hole electrically connecting the conductor layer and the one capacitor conductor layer.

10. The multilayered filter device according to claim 1, wherein each of the third inductor and the fourth inductor includes a first through hole line, a second through hole line, and an inductor conductor layer electrically connected to one end of the first through hole line and one end of the second through hole line, each of the first through hole line and the second through hole line is formed by a plurality of through holes being connected in series, the multilayered filter device further comprises:

a conductor layer electrically connected to another end of the second through hole line of the third inductor and another end of the second through hole line of the fourth inductor; and at least one through hole electrically connecting the conductor layer and ground.

11. A multilayered filter device comprising:

a first filter which is a low-pass filter including a first inductor;

a second filter which is a low-pass filter including a second inductor;

a third filter which is a high-pass filter including a third inductor;

a fourth filter which is a high-pass filter including a fourth inductor; and a stack for integrating the first filter, the second filter, the third filter, and the fourth filter, the stack including a plurality of dielectric layers stacked together, wherein each of the first inductor, the second inductor, the third inductor, and the fourth inductor is wound around an axis orthogonal to a stacking direction of the dielectric layers, the first inductor, the second inductor, the third inductor, and the fourth inductor are arranged in a manner that an opening of the first inductor and an opening of the third inductor face each other, an opening of the second inductor and an opening of the fourth inductor face each other, the opening of the first inductor and the opening of the second inductor do not face each other, and the opening of the third inductor and the opening of the fourth inductor do not face each other, the first inductor and the third inductor are arranged along a first direction orthogonal to the stacking direction, the second inductor and the fourth inductor are arranged along the first direction, the first inductor and the second inductor are arranged along a second direction orthogonal to the stacking direction and the first direction, and the third inductor and the fourth inductor are arranged along the second direction.

12. A multilayered filter device comprising:

a first filter which is a low-pass filter including a first inductor;

a second filter which is a low-pass filter including a second inductor;

a third filter which is a high-pass filter including a third inductor;

a fourth filter which is a high-pass filter including a fourth inductor; and a stack for integrating the first filter, the second filter, the third filter, and the fourth filter, the stack including a plurality of dielectric layers stacked together, wherein each of the first inductor, the second inductor, the third inductor, and the fourth inductor is wound around an axis orthogonal to a stacking direction of the dielectric layers, the first inductor, the second inductor, the third inductor, and the fourth inductor are arranged in a manner that an opening of the first inductor and an opening of the third inductor face each other, an opening of the second inductor and an opening of the fourth inductor face each other, the opening of the first inductor and the opening of the second inductor do not face each other, and the opening of the third inductor and the opening of the fourth inductor do not face each other, each of the first inductor, the second inductor, the third inductor, and the fourth inductor includes a first through hole line, a second through hole line, and an inductor conductor layer electrically connected to one end of the first through hole line and one end of the second through hole line, each of the first through hole line and the second through hole line is formed by a plurality of through holes being connected in series, the stack has a shape that is long in one direction orthogonal to the stacking direction in a plan view seen from the stacking direction, and the inductor conductor layer of each of the first inductor, the second inductor, the third inductor, and the fourth inductor extends along the one direction orthogonal to the stacking direction.

\* \* \* \* \*